United States Patent
Brintzinger et al.

(10) Patent No.: US 6,458,631 B1
(45) Date of Patent: Oct. 1, 2002

(54) METHOD FOR FABRICATING AN INTEGRATED CIRCUIT, IN PARTICULAR AN ANTIFUSE

(75) Inventors: Axel Brintzinger, Dresden (DE); Ulrich Frey, Poughkeepsie, NY (US); Jürgen Lindolf, Friedberg (DE); Dominique Savignac, Ismaning (DE); Stefan Dankowski, München (DE); Matthias Lehr, Dresden (DE); Jochen Müller, München (DE); Kamel Ayadi, Puchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/079,045

(22) Filed: Feb. 19, 2002

(30) Foreign Application Priority Data

Feb. 19, 2001 (DE) .......................... 101 07 666

(51) Int. Cl.[7] .............................................. H01L 21/82
(52) U.S. Cl. ........................................ 438/131; 438/467
(58) Field of Search ........................... 438/131, 128, 438/129, 130, 467, 639, 643, 644, 645; 257/530

(56) References Cited

U.S. PATENT DOCUMENTS

| | | | | | |
|---|---|---|---|---|---|
| 5,904,507 | A | * | 5/1999 | Thomas | 438/128 |
| 6,081,021 | A | * | 6/2000 | Gambino et al. | 257/209 |
| 6,087,677 | A | | 7/2000 | Wu | 257/50 |
| 6,097,077 | A | | 8/2000 | Gordon et al. | 257/530 |
| 6,124,194 | A | * | 9/2000 | Shao et a. | 257/529 |
| 6,335,228 | B1 | * | 1/2002 | Fuller et al. | 438/131 |

* cited by examiner

Primary Examiner—Tuan H. Nguyen

(57) ABSTRACT

The present invention provides a method for fabricating an integrated circuit, comprising the following steps: preparing a circuit substrate (1); providing a metallization region (10a) comprising a first metal in the circuit substrate (1); providing a first insulation layer (25) above the metallization region (10a); forming an opening (13) in the insulating layer (25) in order to uncover at least part of the surface of the metallization region (10a); depositing a functional layer (15') above the resulting structure; depositing a second insulating layer (35) above the resulting structure, in such a manner that the opening (13) is filled; polishing-back of the second insulating layer (35) and of the functional layer (15') in order to uncover the surface of the first insulating layer (25); forming a contact (11a') in the second insulating layer (35) inside the opening (13) in order to make contact with the functional layer (15'); and providing an interconnect (40a) for electrical connection of the contact (11a').

6 Claims, 4 Drawing Sheets

METHOD FOR FABRICATING AN INTEGRATED CIRCUIT, IN PARTICULAR AN ANTIFUSE

The present invention relates to a method for fabricating an integrated circuit, in particular an antifuse, as known from U.S. Pat No. 6,087,677 and U.S. Pat. No. 5,904,507.

Although it can in principle be applied to any desired integrated circuits, the present invention and the problems on which it is based are explained in connection with integrated circuits fabricated using silicon technology.

FIGS. 2a–d diagrammatically depict various process steps involved in a known method for fabricating an integrated circuit using silicon technology.

Figure 2A:
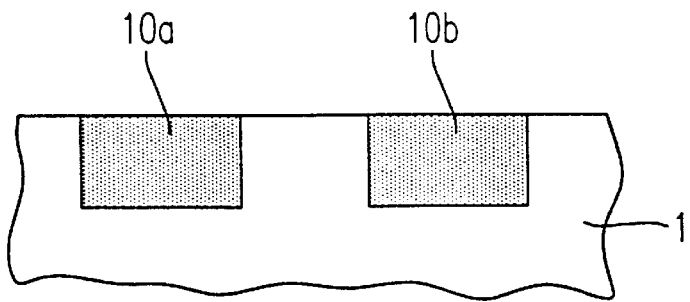

In FIG. 2a, reference numeral 1 denotes a circuit substrate made from silicon dioxide, into which two metallization regions 10a, 10b of tungsten have been introduced. This introduction of the metallization regions 10a, 10b can be achieved, for example, by, following a trench etching step, depositing tungsten over the entire surface of the circuit substrate 1 and then removing the tungsten by chemical mechanical polishing, in such a manner that the separate metallization regions 10a, 10b are formed.

The intention of the method shown is to allow, in addition to standard tungsten contacts on the first metallization region 10a, a second type of contact also to be created, in which a functional layer 15 rests on top of the second metallization region, with which contact is made from above by a contact. In the present case, the functional layer serves as a fusible link and consists cf SiN/Wsi$_x$. However, it could also be a metallic barrier layer or the like.

Figure 2B:
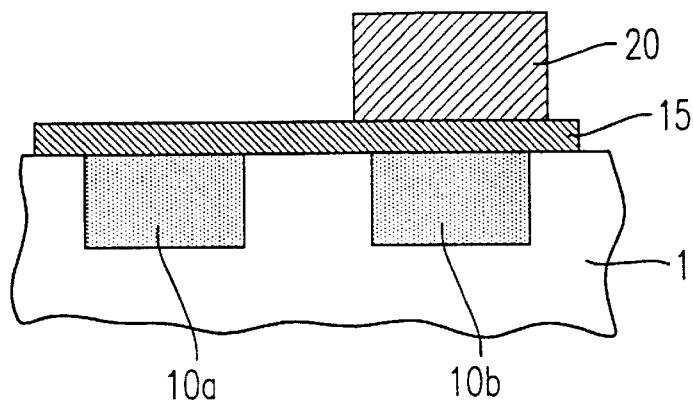

As shown in FIG. 2b, in a subsequent process step the functional layer 15 of SiN/Wsi$_x$ is deposited above the resulting structure, so that it covers the first and second metallization regions 10a, 10b. In a subsequent process step, a photomask 20 is formed in such a manner that it covers the functional layer 15 over the second metallization region 10b but leaves the functional layer 15 above the first metallization region 10a clear.

Figure 2C:
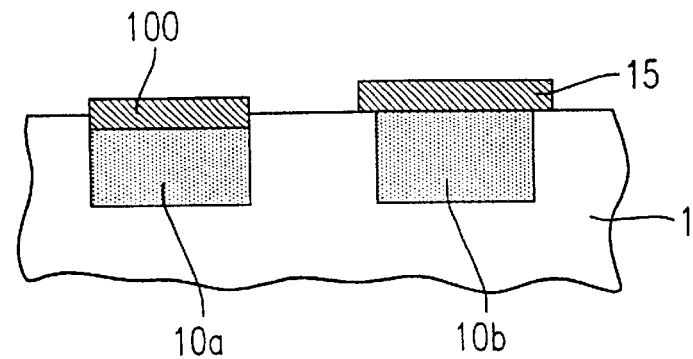

Then, referring now to FIG. 2c, an etching process and a resist-stripping operation takes place, for example in an NF$_3$-containing plasma, in order to remove the functional layer 15 above the first metallization region 10a. During this etching operation and during the stripping of the resist, an oxide film 100 comprising WO$_x$ is formed above the tungsten of the first metallization region 10a. A disadvantage is that it is impossible to avoid the formation of a WO$_x$ layer of this type.

Figure 2D:
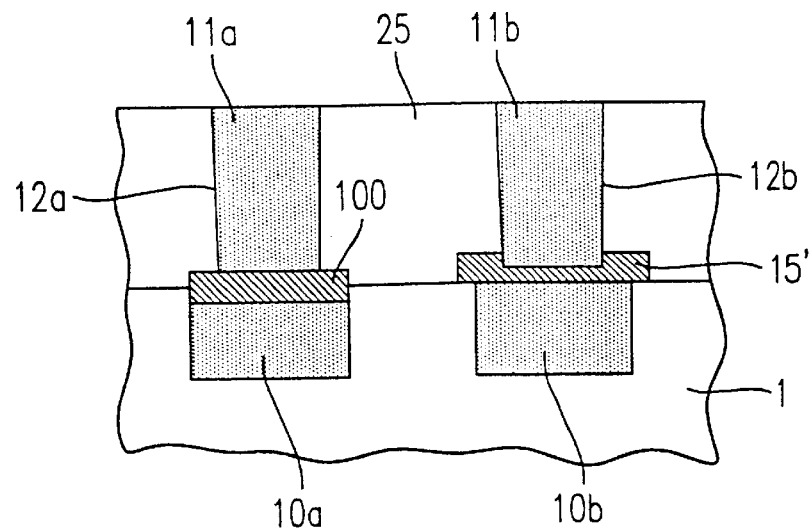

As shown in FIG. 2d, following the preceding process step, an insulating layer 25, for example of silicon dioxide, is deposited over the entire surface of the resulting structure. Then, contact hole 12a, 12b are formed above the first and second metallization regions 10a, 10b, respectively, and these holes are filled with contacts 11a, 11b consisting of tungsten. This filling with the contacts can be effected in a similar manner to the formation of the first and second metallization regions 10a, 10b by depositing tungsten over the entire surface of the structure including the contact holes 12a, 12b and then partially removing this tungsten again by chemical mechanical polishing.

As can be seen from FIG. 2d, in the known process the oxide film 100 is retained, and consequently the contact resistance between contact 11a and the first metallization region 10a is increased undesirably.

The general problem on which the present invention is based is therefore that the surfaces of certain metal layers or tracks, for example when tungsten is used as a metal, may oxidise at the surface under the action of certain etching gases.

By way of example, WO$_x$ layers of this type have the drawback of having a considerably higher resistance than pure tungsten, with the result that the contact resistance is increased with respect to higher levels which are connected thereto by a contact. Furthermore, some of the tungsten is consumed during the formation of the WO$_x$ tungsten layers, with the result that the sheet resistance of the tungsten track is increased and the planarity is disrupted.

Figure 3:
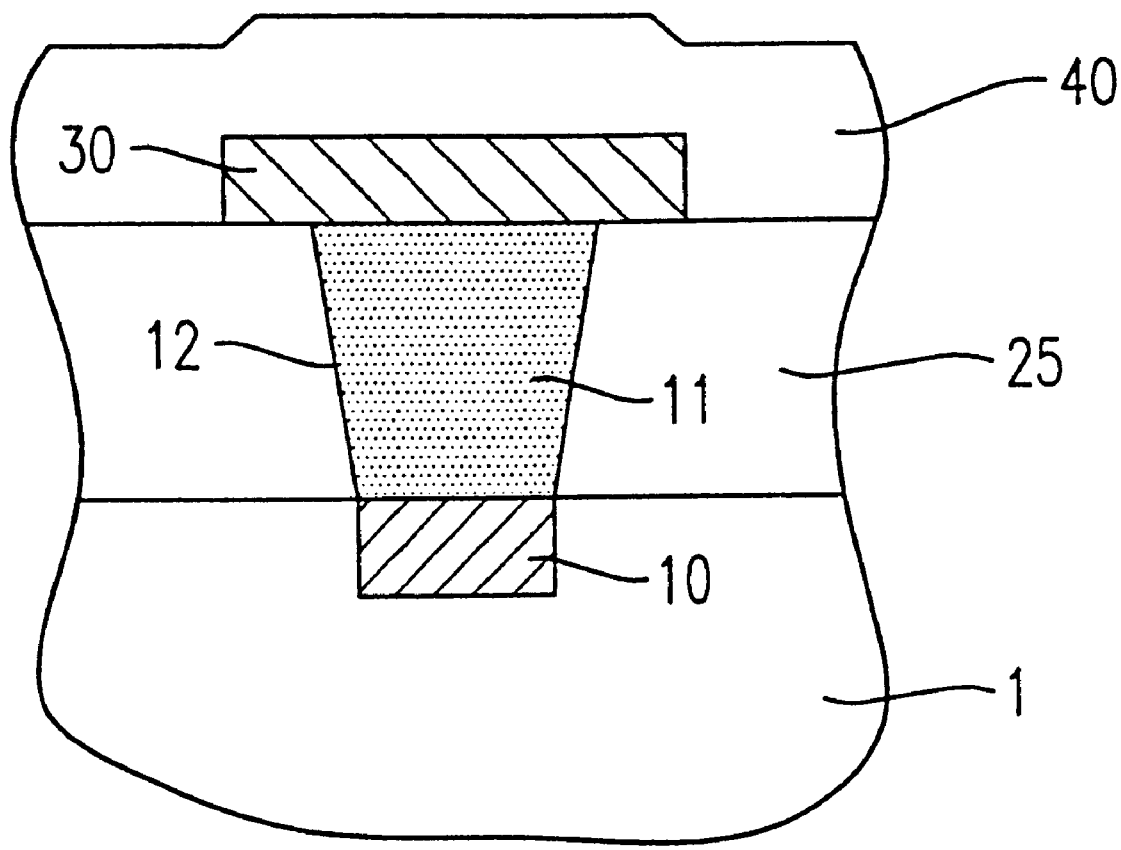

FIG. 3 shows an example of a fusible link, in which a functional layer 30 of amorphous silicon is deposited above the level of the contact hole 12 comprising the contact 11 and is patterned, as is known, for example, from U.S. Pat. No. 6,097,077. After the patterning, an interconnect 40 is provided above the resulting structure, which the fusible link can be blown. The fact that the layer 30 of amorphous silicon has a considerable thickness and therefore requires high voltages and currents in order to be blown, has proven to be a drawback of this structure.

Therefore, it is an object of the present invention to provide a method for fabricating an integrated circuit in which it is possible to counteract deterioration of the contacts and an increase in the bulk resistance as a result of the etching of the functional layer and tie stripping of the resist and, at the same time, thin functional layers are possible.

According to the invention, this object is achieved by the fabrication method described in Claim 1.

The idea on which the present invention is based consists in placing the functional layer or fuse layer in an opening which is situated in a further insulating layer on the contact insulating layer. As a result, the metallization level is protected during patterning of the functional layer.

Compared to the known attempted solution, the fabrication method according to the invention has the advantage, inter alia, that a thin fuse or the like is obtained, the patterning of which does not attack the metallization below it.

The subclaims define advantageous refinements and improvements of the fabrication method given in Claim 1.

According to a preferred refinement, the functional layer is formed by depositing a layer stack having at least two layers, the lower layer being a further insulating layer and the upper layer being a conductive layer.

According to a further preferred refinement, a further metallization region is formed in the circuit substrate in the plane of the first metallization region, and a further contact is formed, at the same time as the first contact, in the first insulating layer, outside the opening, in order to make contact with the further metallization region.

According to a further preferred refinement, the lower layer contains Si$_3$N$_4$, SiO$_2$ or combinations thereof.

According to a further preferred refinement, the upper layer comprises a metal, a metal compound or polysilicon.

According to a further preferred refinement, the lower layer is an Si$_3$N$_4$ layer which is from 1 nm to 5 nm thick, and the upper layer is a WSi layer which is from 0 to 30 nm thick.

An exemplary embodiment of the invention is illustrated in the drawings and explained in more detail in the description below, in which:

FIGS. 1a–f show diagrammatic illustrations of various process steps involved in a method for fabricating an integrated circuit using silicon technology, as an embodiment of the present invention;

FIGS. 2a–d show diagrammatic illustrations of various process steps involved in a known method for fabricating an integrated circuit using silicon technology; and FIG. 3 shows an example of a fusible link, in which a functional layer of amorphous silicon is disposed above the level of the contact hole.

In the figures, identical reference symbols denote identical components or components which have an identical function.

FIGS. 1a–f show diagrammatic illustrations of various process steps involved in a method for fabricating an integrated circuit using silicon technology, as an embodiment of the present invention.

Figure 1A:
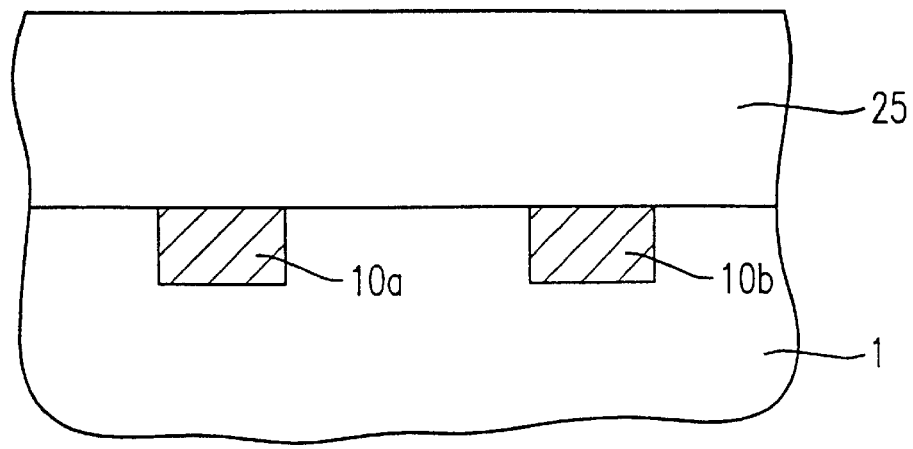

In the method or fabricating an integrated circuit according to this embodiment, first of all, as shown in FIG. 1a, a circuit substrate 1 is prepared, in which, then, metallization regions 10a, 10b of a first metal, e.g. Al, are provided. Then, a first insulating layer 25, for example of $SiO_2$, is applied above the metallization regions 10a, 10b.

Figure 1B:
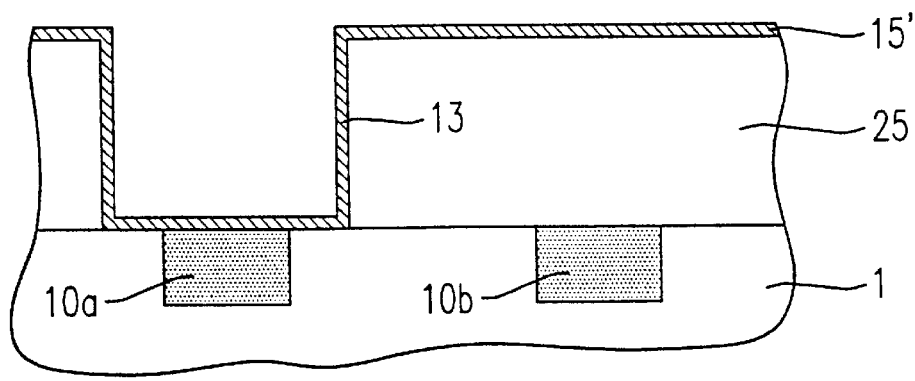

Next, as shown in FIG. 1b, an opening 13 is formed in the first insulating layer 25 of $SiO_2$ using a standard photolithographic etching technique, and this is followed by depositing a functional layer 15', which has, for example, the function of a fuse, over the entire surface. The functional layer 15' comprises, for example, a lower layer in the form of a further insulating layer and an upper layer in the form of a conductive layer. In the present example, the lower layer is an $Si_3N_4$ layer which is from 1 nm to 5 nm thick, and the upper layer is a WSi layer which is from 10 to 30 nm thick. Either a conformal or a non-conformal method can be used for the deposition.

Figure 1C:
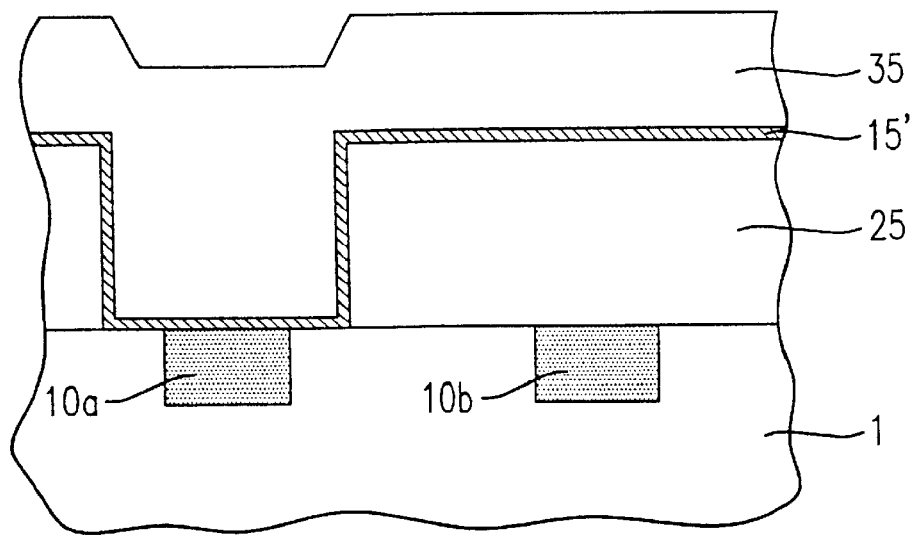

In a following step, as shown in FIG. 1c, a second insulating layer 35, e.g. also of $SiO_2$, is applied above the resulting structure.

Figure 1D:
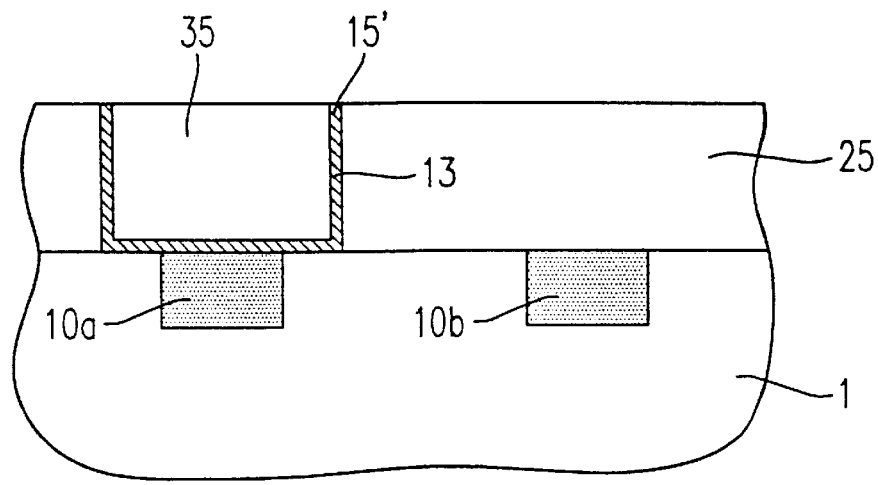

Then, this second insulating layer 35 of $SiO_2$ is polished down, by chemical mechanical polishing, until firstly the target layer thickness for the first insulating layer 25 is reacted and, secondly, the fuse stack or the functional layer 15' remains only in the opening 13. The latter state is shown in FIG. 1d.

Figure 1E:
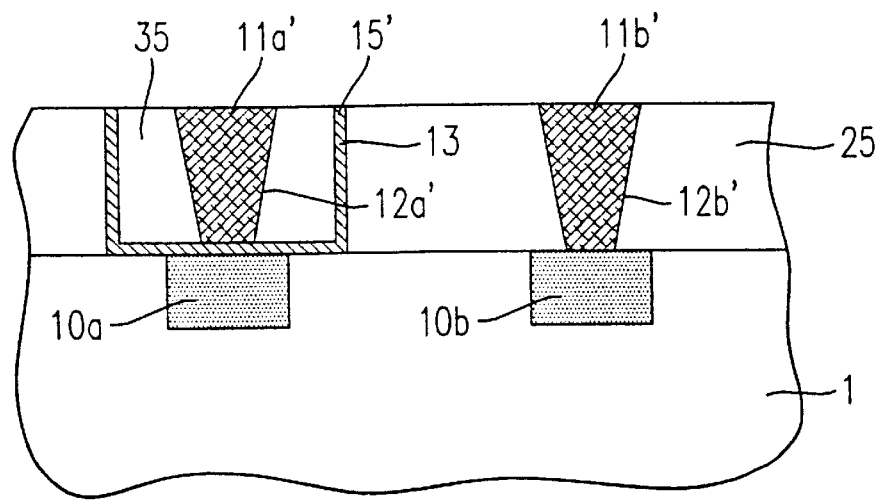

Then, as shown in FIG. 1e, contacts 11a', 11b' are formed in contact holes 12a', 12b' in order to make contact with the functional layer 15' at the bottom of the opening 13 and to make contact with the metallization region 10b.

In detail, this is effected by form the contact holes 12a', 12b' by means of a photolithographic etching technique, depositing the contact metal (e.g. W or Al) over the entire surface and polishing the contact metal back by chemical mechanical polishing.

Figure 1F:
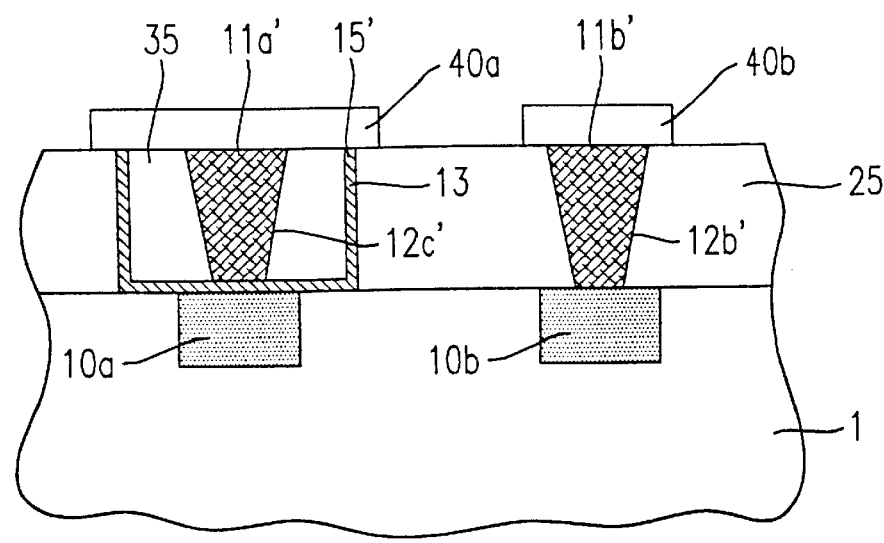

Finally, referring now to FIG. 1f, interconnects 40a, 40b are provided for the purpose of electrical connection of the contacts 11a', 11b'.

The result is a thin fuse, the patterning step of which does not attack the metallization below it.

Although the present invention has been described above with reference to a preferred exemplary embodiment, it is not restricted to this exemplary embodiment, but rather can be modified in numerous ways.

In particular, the choice of layer materials and etchants is given only by way of example and can be varied in numerous ways.

List of Reference Symbols

| 10a, b; 10 | Metallization region |
|---|---|
| 1 | Circuit substrate |
| 15, 15' | Functional layer |
| 35 | Insulating layer |
| 100 | Oxide film |
| 25 | Insulating layer |

-continued

| 12a, b; 12; 12a', 12b' | Contact holes |
|---|---|
| 11a, b; 11; 11a', 11b' | Contacts |
| 40a, 40b | Interconnect |
| 13 | Opening |

What is claimed is:

1. Method for fabricating an integrated circuit, comprising the following steps:

preparing a circuit substrate (1);

providing a metallization region (10a) comprising a first meal In the circuit substrate (1);

providing a first insulator layer (25) above the metallization region (10a);

forming an opening (13) in the insulating layer (25) in order to uncover at least part of the surface of the metallization region (10a);

depositing a functional layer (15') above the resulting structure, including the base surface and side walls of the opening (13);

depositing a second insulating layer (35) above the resulting structure, in such a manner that the opening (13) is filled;

planarizing polishing-back of the second insulating layer (35) and of the functional layer (15') in order to uncover the surface of the first insulating layer (25), the functional layer (15') remaining only in the opening (13);

forming a contact hole (12a') in the second insulating layer (35) inside the opening (13), which hole extends as far as the surface of the functional layer (15') and filling the contact hole (12a') with a contact metal in order to form a contact and in order to make contact with the functional layer (15'); and providing an interconnect (40a) for electrical connection of the contact (11a').

2. Method according to claim 1, characterized in that the functional layer (15') is formed by depositing a layer stack having at least two layers, the lower layer being a further insulating layer and the upper layer being a conductive layer.

3. Method according to claim 2, characterized in that the lower layer contains $Si_3N_4$, $SiO_2$ or combinations thereof.

4. Method according to claim 2, characterized in that the upper layer comprises a metal, a metal compound or polysilicon.

5. Method according to claim 2, characterized in that the lower layer (15a) is an $Si_3N_4$ layer which is from 1 nm to 5 nm thick, and the upper layer (15b) is a WSi layer which is from 10 to 30 nm thick.

6. Method according to claim 1, characterized in that a further metallization region (10b) is formed in the circuit substrate (1), in the plane of the first metallization region (10a), and a further contact (11b) is formed, at the same time as the first contact (11a'), in the first insulating layer (25), outside the opening (13), in order to make contact with the further metallization region (10b).

* * * * *